(12) United States Patent
Kim et al.

(10) Patent No.: US 10,218,054 B2
(45) Date of Patent: Feb. 26, 2019

(54) ANTENNA FOR DEVICE

(71) Applicant: Samsung Electronics Co., Ltd., Gyeonggi-do (KR)

(72) Inventors: Dae Woong Kim, Gyeonggi-do (KR); Cheol Ho Lee, Gyeonggi-do (KR); Ji Heon Yu, Gyeonggi-do (KR); Il Hyung Chung, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 88 days.

(21) Appl. No.: 15/224,880

(22) Filed: Aug. 1, 2016

(65) Prior Publication Data

US 2017/0040671 A1 Feb. 9, 2017

(30) Foreign Application Priority Data

Aug. 4, 2015 (KR) .................. 10-2015-0110070

(51) Int. Cl.
| | |
|---|---|
| H01Q 1/24 | (2006.01) |
| H01Q 1/50 | (2006.01) |
| H01R 12/71 | (2011.01) |
| H01Q 1/38 | (2006.01) |
| H01Q 1/48 | (2006.01) |

(52) U.S. Cl.
CPC .............. *H01Q 1/243* (2013.01); *H01Q 1/38* (2013.01); *H01Q 1/48* (2013.01); *H01Q 1/50* (2013.01); *H01R 12/714* (2013.01)

(58) Field of Classification Search
CPC .. H01Q 1/50; H01Q 1/24; H01Q 1/38; H01Q 1/48

USPC ......................................................... 343/702
See application file for complete search history.

(56) References Cited

U.S. PATENT DOCUMENTS

| | | | | |
|---|---|---|---|---|
| 5,451,966 | A * | 9/1995 | Du ...................... | H01Q 1/1285 333/24 C |
| 7,645,675 | B2 | 1/2010 | Coolbaugh et al. | |
| 7,889,143 | B2 * | 2/2011 | Milosavljevic ........ | H01Q 1/243 343/722 |
| 9,306,274 | B2 * | 4/2016 | Tayama ................... | H01Q 1/38 |
| 2005/0024268 | A1 * | 2/2005 | McKinzie, III ....... | H01Q 9/0421 343/700 MS |
| 2006/0141944 | A1 * | 6/2006 | Shibagaki .............. | H04B 1/006 455/78 |
| 2006/0158281 | A1 * | 7/2006 | Garris ................ | H03H 9/02921 333/133 |

(Continued)

FOREIGN PATENT DOCUMENTS

| | | |
|---|---|---|
| EP | 2 988 367 A1 | 2/2016 |
| JP | 2011-096601 A | 5/2011 |

(Continued)

OTHER PUBLICATIONS

European Search Report, dated Dec. 22, 2016.

*Primary Examiner* — Huedung Mancuso
(74) *Attorney, Agent, or Firm* — Cha + Reiter, LLC.

(57) ABSTRACT

An antenna for an electronic device is disclosed that can reduce or prevent problems such as a shock hazard and/or an Electrostatic Discharge (ESD) issue, particularly in the case when device are subjected to impact such as being dropped. The antenna includes a radiator; an antenna clip connected with a metallic housing of the electronic device; a capacitor includes a part of the antenna clip; and a feeding part and a ground for operating the antenna.

16 Claims, 11 Drawing Sheets

(56) References Cited

U.S. PATENT DOCUMENTS

| | | |
|---|---|---|
| 2007/0190760 A1 | 8/2007 | Coolbaugh et al. |
| 2011/0286174 A1* | 11/2011 | Na .................... H01Q 1/243 |
| | | 361/679.41 |
| 2014/0128007 A1* | 5/2014 | Chen .................... H04B 1/18 |
| | | 455/77 |
| 2014/0306847 A1 | 10/2014 | Wang |
| 2014/0333494 A1* | 11/2014 | Huang .................. H01Q 1/002 |
| | | 343/720 |
| 2015/0084817 A1 | 3/2015 | Yong |
| 2016/0049720 A1 | 2/2016 | Hwang et al. |
| 2016/0242291 A1* | 8/2016 | Park .................... H05K 1/0259 |

FOREIGN PATENT DOCUMENTS

| | | |
|---|---|---|
| KR | 10-2014-0036426 A | 3/2014 |
| KR | 10-1398156 B1 | 5/2014 |

* cited by examiner ical Property Office and assigned
ANTENNA FOR DEVICE

CLAIM OF PRIORITY

This application claims the benefit under 35 U.S.C. § 119(a) from a Korean patent application filed on Aug. 4, 2015 in the Korean Intellectual Property Office and assigned Serial number 10-2015-0110070, the entire disclosure of which is hereby incorporated by reference.

BACKGROUND

Field of the Disclosure

The present disclosure relates to an antenna that uses a capacitance component as a part of the antenna.

Description of the Related Art

With the development of information and communications technology, network devices, such as a base station and the like, have been installed all across the country. An electronic device wirelessly sends and receives data to and from another electronic device over a network to allow a user to utilize the network freely across the country.

However, the electronic device has to be equipped with an antenna to utilize the network. Antenna technology has been developing along with the development of the information and communications technology. Recently, technology has been developed that makes it possible to use a metallic case of the electronic device as a part of the antenna.

In an electronic device including a metallic housing, since metal is exposed to the external environment, the metallic housing may cause an electric shock hazard if there is a problem with the electronic device, such as a short circuit. The electric shock hazard may be prevented by post-processing the metallic housing, for example, plating, painting, oxidation, or the like. However, the electric shock hazard can occur if a protective layer that is formed through the post-processing of the metallic case is damaged. Furthermore, an electrostatic discharge (ESD) issue can still occur due to the metallic housing of the electronic device.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure address at least some of the above-mentioned problems and/or disadvantages and to provide at least some of the advantages described below. Accordingly, an aspect of the present disclosure is to provide an antenna that utilizes a capacitive component as a part of the antenna in a manner such that a shock hazard and an Electrostatic Discharge (ESD) issue of conventional structures is prevented.

In one embodiment of the disclosure, An antenna for an electronic device comprising: a radiator; an antenna clip connected to a metallic housing of the electronic device, in which a part of the antenna clip comprises at least a first conductor of a capacitor; a feeding part connected with a first portion of the radiator; and a ground connected with a second portion of the radiator and the capacitor.

Other aspects, advantages, and salient features of the disclosure will become better appreciated to those of ordinary skill in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will become more appreciated by an artisan from the following description taken in conjunction with the accompanying drawings, in which.

Throughout the drawings, it should be noted that like reference numbers are used to depict the same or similar elements, features, and structures.

DETAILED DESCRIPTION

Figure 1:
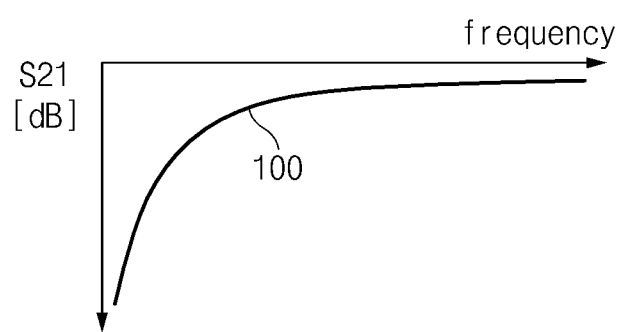
FIG. 1 is a graph illustrating a transfer characteristic of a capacitor depending on a frequency value, according to an embodiment.

Hereinafter, various embodiments of the present disclosure are disclosed with reference to the accompanying drawings. It should be understood that the present disclosure is not limited by the various embodiments of the present disclosure to a specific embodiment and it is intended that the present disclosure covers all modifications, equivalents, and/or alternatives of the present disclosure provided they come within the scope of the appended claims and their equivalents. With respect to the descriptions of the accompanying drawings, like reference numerals refer to like elements.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st," "2nd," "first," "second," and the like used herein may refer to modifying various different elements of various embodiments of the present disclosure, but do not limit the elements. For instance, "a first user device" and "a second user device" may indicate different users regardless of order or importance. For example, a first component may be referred to as a second component and vice versa without departing from the scope and spirit of the present disclosure.

In various embodiments of the present disclosure, when a component (for example, a first component) is referred to as being "operatively or communicatively coupled with/to" or "connected to" another component (for example, a second component), the component may be directly connected to the other component or connected through another component (for example, a third component). In various embodiments of the present disclosure, it is intended that when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of" For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

Terms used in various embodiments of the present disclosure are used to describe certain embodiments of the present disclosure, but do not limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the present specification do not exclude embodiments of the present disclosure that may not be expressly shown and described herein.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit)

In some various embodiments of the present disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ or PlayStation™), an electronic dictionary, an electronic key, a camcorder, or an electronic picture frame In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the present disclosure may be a flexible device. An electronic device according to an embodiment of the present disclosure is not limited to the above-mentioned devices, and may include new electronic devices with the development of new technology.

Hereinafter, an electronic device according to various embodiments of the present disclosure will be described in more detail with reference to the accompanying drawings. The term "user" used herein may refer to a person who uses or operates an electronic device or may refer to a device (e.g., an artificial intelligence electronic device) that uses or operates an electronic device.

FIG. 1 is a graph illustrating a transfer characteristic of a capacitor depending on a frequency value, according to an embodiment.

Referring now to FIG. 1, the x-axis of a graph 100 represents a frequency, and the y-axis thereof represents a magnitude of power in decibels. It is assumed that a capacitance value of a capacitor is fixed in the graph 100. The graph 100 may have a small power value at a low frequency and a great power value at a high frequency. In other words, the capacitor may pass a high frequency band well and may cut off (or attenuate) a low frequency band.

Since impedance of the capacitor is $1/j\omega C$, the capacitor may operate as an open circuit at the low frequency and as a short circuit at the high frequency. As such, the capacitor may block a direct current (DC) and pass an alternating current (AC).

Accordingly, if a capacitive component is connected between the metallic housing and a ground, even though an electronic device is being charged, the DC does not flow to a user, which grasps the electronic device, through the metallic housing. That is, the electric shock may not occur. Also, the capacitive component may prevent the ESD issue from happening.

Figure 2:
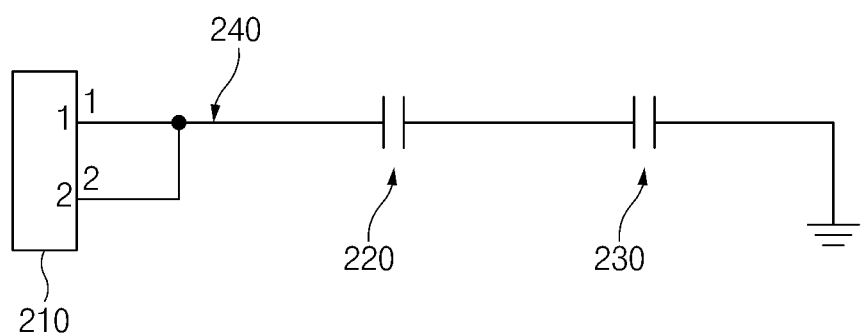
FIG. 2 is a circuit diagram of an antenna of a conventional electronic device.

FIG. 2 is a circuit diagram of an antenna of a conventional electronic device.

An antenna of the conventional electronic device includes a radiator 210, a first capacitor 220, a second capacitor 230, a feeding part, and a ground. The radiator 210 is connected with the ground through the first capacitor 220 and the second capacitor 230. Although not illustrated in FIG. 2, the radiator 210 may be further connected with the feeding part (not shown) so as to be supplied with a current from the electronic device.

The first capacitor 220 and the second capacitor 230 may block the DC. Since the DC is blocked by only one of the first capacitor 220 and the second capacitor 230, the other thereof may be provided as a spare part. That is, only one capacitor may be connected to the radiator 210 of FIG. 2.

The antenna of the conventional electronic device may further include an antenna clip. In this case, the antenna clip may be situated at a point (e.g., between the radiator 210 and the first capacitor 220) expressed by a reference numeral 240.

Figure 3A:
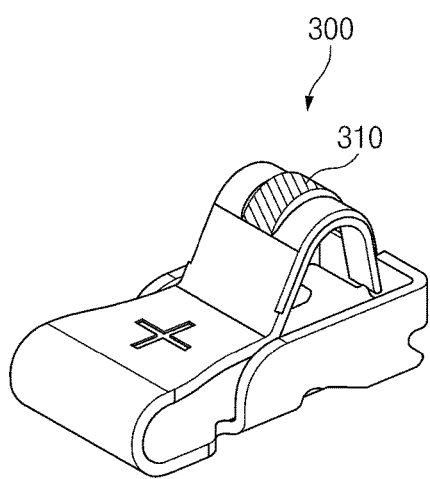
FIG. 3A and FIG. 3B are perspective views of the antenna clip of a conventional electronic device.
Figure 3B:
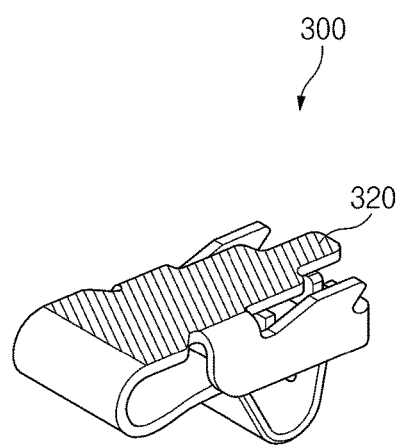
Figure 4:
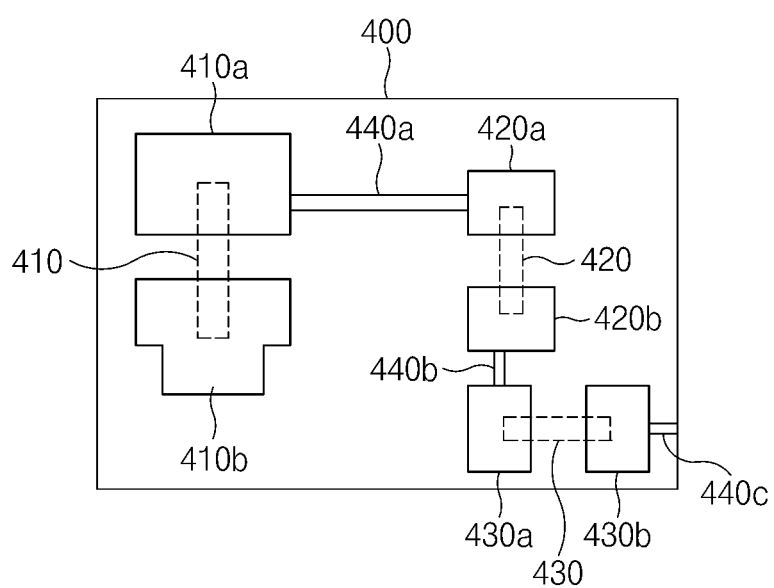
FIG. 4 is a diagram illustrating an antenna clip and a capacitor mounted on a printed circuit board of a conventional electronic device.

FIGS. 3A and 3B are perspective views of the antenna clip of the conventional electronic device. FIG. 3A is a perspective view of an upper side of an antenna clip 300, and FIG. 3B is a perspective view of a lower side of the antenna clip 300. FIG. 4 is a view illustrating the antenna clip and a capacitor mounted on a printed circuit board of the conventional electronic device.

Referring now to FIGS. 3A and 3B, a connector 310 of the antenna clip 300 is connected with the radiator 210 of FIG. 2. Also, a bottom surface 320 of the antenna clip 300 is connected with the first capacitor 220 of FIG. 2.

A printed circuit board 410 is illustrated in FIG. 4. A reference numeral 410 denotes a location on which the antenna clip 300 is to be mounted, and reference numerals 410a and 410b denote locations on which lead pads for fixing the antenna clip 300 to the printed circuit board 400 are to be provided. The antenna clip 300 is situated such that the bottom surface 320 thereof is in direct contact with the printed circuit board 400.

In FIG. 4, a reference numeral 420 denotes a location on which the first capacitor 220 is to be mounted, and reference numerals 420a and 420b denote locations on which lead pads for fixing the first capacitor 220 to the printed circuit board 400 are to be provided. Also, a reference numeral 430 denotes a location on which the second capacitor 230 is to be mounted, and reference numerals 430a and 430b denote locations on which lead pads for fixing the second capacitor 230 to the printed circuit board 400 are to be provided.

A reference numeral 440a denotes a connection line (e.g., a trace) connecting the antenna clip 300 with the first capacitor 220, a reference numeral 440b denotes a connection line connecting the first capacitor 220 with the second capacitor 230, and a reference numeral 440c denotes a connection line connecting the second capacitor 230 with the ground (not shown).

Even though a component capacitor is used as a DC blocking member, if an electronic device is impacted when a user drops the electronic device, the component capacitor may be cracked (or broken into pieces), thereby causing the electric shock hazard and the ESD issue. For this reason, as illustrated in FIGS. 2 and 4, two capacitors are used in the electronic device. However, this causes a cost increase and a space issue.

Furthermore, the component capacitor may be prone to loss, ESD, leakage current, and the like due to the limit of its own characteristics.

Figure 5A:
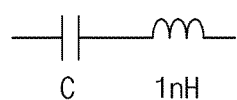
FIG. 5A shows a circuit including a capacitor and an inductor.
Figure 5B:
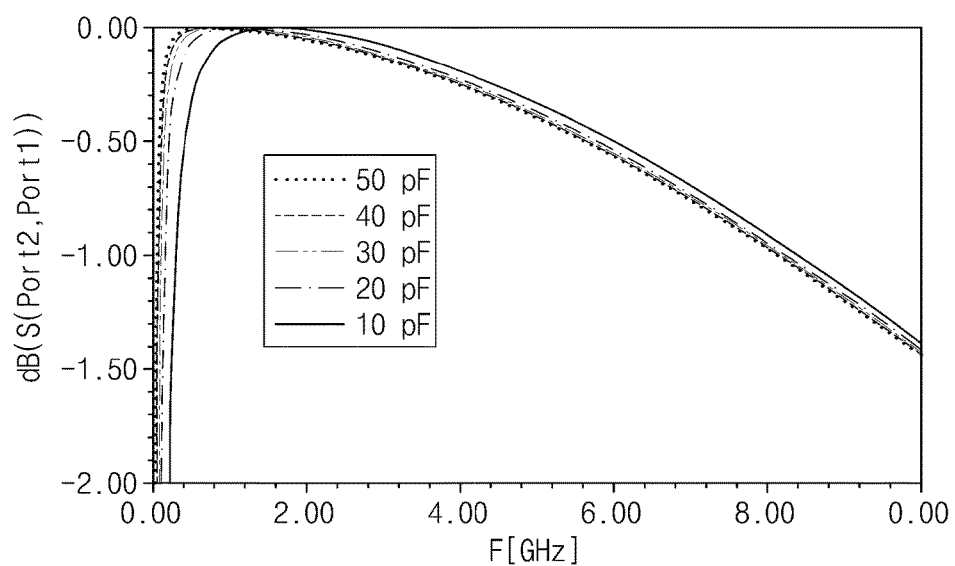
FIG. 5B is a graph illustrating an antenna characteristic depending on a capacitance value of the capacitor, according to various embodiments of the present disclosure.

FIG. 5A shows a circuit including a capacitor and an inductor, and FIG. 5B is a graph illustrating an antenna characteristic depending on a capacitance value of the capacitor, according to various embodiments of the present disclosure.

FIG. 5A shows a circuit that includes a capacitor that will be varied in value for the purposes of illustration, and an inductor having an inductance value of, for example, 1 nH. The capacitor and the inductor are connected in series. FIG. 5B is a graph illustrating an antenna characteristic of the circuit illustrated in FIG. 5A.

In FIG. 5B, there are illustrated graphs indicating antenna characteristics in the case where the capacitor illustrated in FIG. 5A have capacitance values of 10 pF, 20 pF, 30 pF, 40 pF, and 50 pF, respectively.

Referring now to FIG. 5B, as a capacitance value becomes greater, a frequency band with the greatest power magnitude may gradually move to a low frequency band. When an inductance value is the same in an LC circuit, the greater the capacitance value, the lower a resonance frequency. For this reason, as the capacitance value becomes greater, a transfer characteristic of power (or signal) may become more excellent in a low frequency region. For example, in the case where the capacitance value is 10 pF, an antenna may transfer the greatest power at 1.5 GHz; in the case where the capacitance value is 50 pF, the antenna may transfer the greatest power at 0.6 GHz.

Figure 6A:
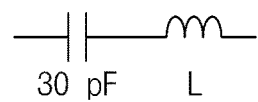
FIG. 6A shows a circuit including a capacitor and an inductor.
Figure 6B:
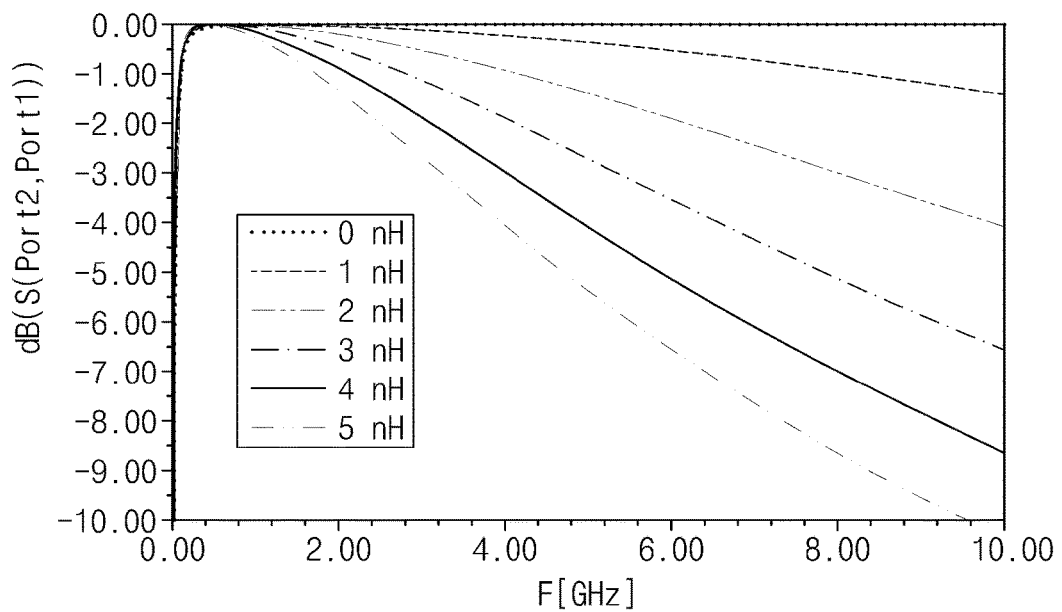
FIG. 6B is a graph illustrating antenna characteristics depending on an inductance value, according to various embodiments of the present disclosure.

FIG. 6A shows a circuit including a capacitor and an inductor, and FIG. 6B is a graph illustrating antenna characteristics depending on an inductance value, according to various embodiments of the present disclosure.

FIG. 6A shows a circuit that includes a capacitor having a capacitance value of 30 pF and an inductor that for the purposes of illustration, will be varied. The capacitor and the inductor are connected in series. FIG. 6B is a graph illustrating antenna characteristics of the circuit illustrated in FIG. 6A.

In FIG. 6B, there are illustrated graphs indicating antenna characteristics in the case where the inductor illustrated in FIG. 6A have inductance values of 0 nH, 1 nH, 2 nH, 3 nH, 4 nH, and 5 nH, respectively.

Referring now to FIG. 6B, it may be understood that the magnitude of power becomes gradually smaller from about 0.5 GHz as the inductance value becomes greater. In other words, it is understood that a transfer characteristic becomes worse in a high frequency region as the inductance value becomes greater. For example, with regard to −3 dB, the antenna may transfer power up to about 8 GHz if the inductance value is 2 nH and may transfer power up to about 4 GHz if the inductance value is 4 nH.

An inductance component may be generated when the antenna clip 410 is connected with the capacitors 420 and 430 via the traces 440a to 440c on the printed circuit board 400 as illustrated in FIG. 4. Furthermore, in the case where each of the capacitors 420 and 430 is a component capacitor, it may include self-inductance. Accordingly, the self-inductance may deteriorate performance of the antenna in a high frequency region.

Figure 7:
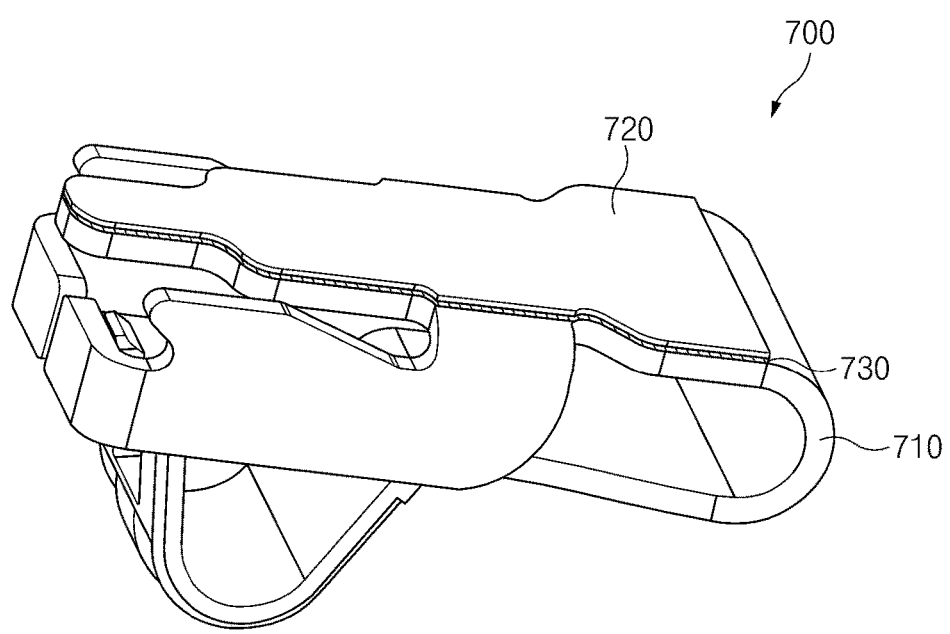
FIG. 7 is a perspective view illustrating an antenna clip and a capacitor using the antenna clip as a first conductor, according to various embodiments of the present disclosure.

FIG. 7 is a perspective view illustrating an antenna clip and a capacitor using the antenna clip as a first conductor, according to various embodiments of the present disclosure.

An antenna clip 710 may correspond to the antenna clip 300 of FIG. 3. A metallic plate 720 is attached to a bottom surface of the antenna clip 710 by an adhesive 730.

According to various embodiments of the present disclosure, each of the antenna clip 710 and the metallic plate 720 may be formed of a conductive material, and the adhesive 730 may be formed of a non-conductive material. Accordingly, the bottom surface of the antenna clip 710, the metallic plate 720, and the adhesive 730 may constitute a capacitor 700. For example, the bottom surface of the antenna clip 710, the metallic plate 720, and the adhesive 740 may correspond to a first conductor, a second conductor, and a dielectric of the capacitor 700, respectively.

The metallic plate 720 may be connected to a printed circuit board, and an upper side (e.g., the connector 310 of FIG. 3) of the antenna clip 710 may be connected to the radiator. In this case, the radiator may be an antenna pattern including at least a part of the metallic housing of the electronic device.

According to various embodiments of the present disclosure, the capacitor 700 may be designed to have a capacitance value large enough to block a DC voltage. A method of designing a capacitance value of a capacitor will be described with reference to FIG. 8.

Figure 8A:
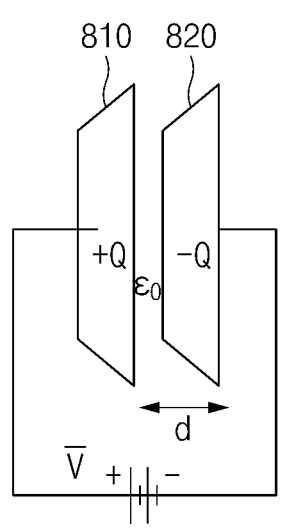
FIG. 8A and FIG. 8B are views for describing various factors that are used to determine a capacitance value of a capacitor, according to various embodiments of the present disclosure.
Figure 8B:
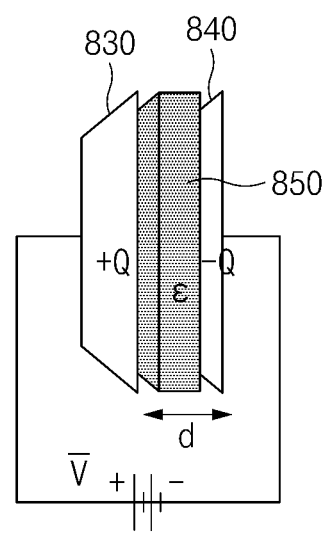

FIGS. 8A and 8B are views for describing various factors that are used to determine a capacitance value of a capacitor, according to various embodiments of the present disclosure.

FIG. 8A shows a capacitor in which a two plates in the form of a first conductor 810 and a second conductor 820 are parallel with each other. In this case, air between the first conductor 810 and the second conductor 820 may act as a dielectric. The dielectric constant of air may be ε0. In this case, a capacitance value C may be a value that is obtained by dividing a product of the dielectric constant ε0 of the air and an area A of the conductors 810 and 820 by a distance d between the conductors 810 and 820.

FIG. 8B shows a capacitor in which a first conductor 830 and a second conductor 840 are parallel with each other. Referring to FIG. 8B, the capacitor may further include a dielectric 850 that is between the first conductor 830 and the second conductor 840 and has dielectric constant ε. In this case, a capacitance value C may be a value that is obtained by dividing a product of the dielectric constant ε of the dielectric 850 and an area A of the conductors 830 and 840 by a distance d between the conductors 830 and 840.

Accordingly, at least one or more of the area of the metallic plate 720 of FIG. 7, the dielectric of the adhesive 730, or a thickness of the adhesive 730 may be designed to have a capacitance value sufficient to block a DC component. For example, the capacitance value may be designed to be 10 pF or more, and the dielectric constant of the adhesive 730 may have a relatively large value, for example, may be 12 F/m or more.

According to various embodiments of the present disclosure, the capacitor 700 of FIG. 7 may include the metallic plate 720, which has a surface area greater than that of the component capacitor and may be coupled to the antenna clip 710 through the adhesive 730 provided on a wide surface area. Accordingly, even in the event an impact is applied to the electronic device from the outside, the metallic plate 720 may not be detached from the antenna clip 710.

Furthermore, since both traces on the printed circuit board and a component capacitor are not used, the capacitor 700 may include an inductance component.

Figure 9:
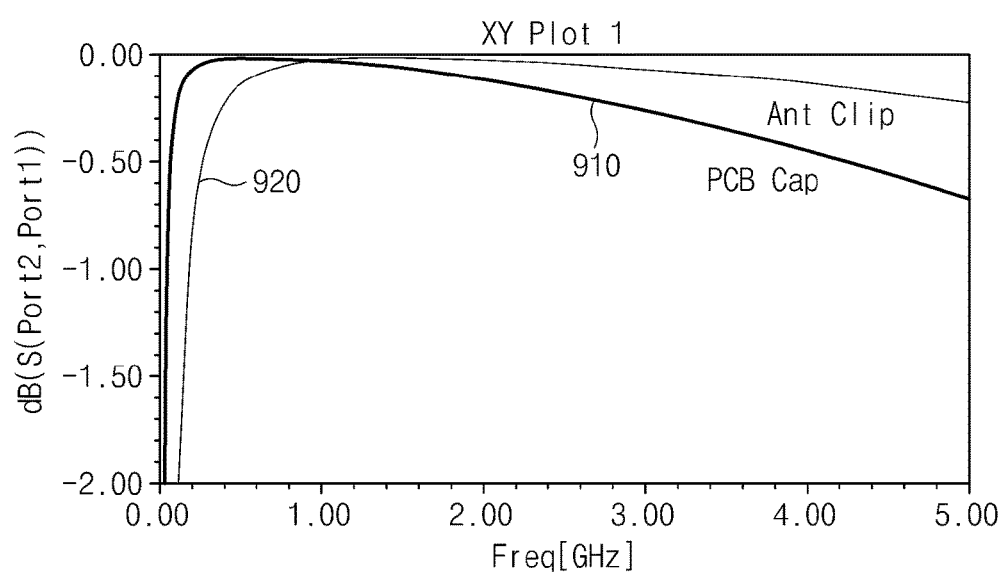
FIG. 9 is a graph illustrating antenna characteristics in the case that a capacitor using an antenna clip as a first conductor is used as a DC blocking member and that a component capacitor mounted on a printed circuit board is used.

FIG. 9 is a graph illustrating antenna characteristics in the case in which a capacitor using an antenna clip as a first conductor is used as a DC blocking member and that a component capacitor mounted on a printed circuit board is used.

A graph 910 may be a graph in the case where an embodiment of the present disclosure is implemented with a component capacitor on a printed circuit board as illustrated in FIG. 4. Also, a graph 920 may be a graph in the case where an embodiment of the present disclosure is implemented with a capacitor in which a metallic plate is attached to an antenna clip with an adhesive.

A capacitor with characteristics corresponding to the graph 910 may be implemented with two capacitors, each of which has a capacitance value 0.1 nF and which are connected in series. In this case, the total capacitance value is about 50 pF. A capacitor corresponding to the graph 920 may include a dielectric having dielectric constant of 12 F/m and a thickness of 15 um. In this case, a capacitance value of the capacitor is about 18 pF.

Compared to the capacitor with characteristics corresponding to the graph 910, the capacitor with characteristics corresponding to the graph 920 may have a relatively small capacitance value. For this reason, the capacitor corresponding to the graph 920 may be relatively vulnerable to a low frequency band and may be relatively strong to a high frequency band. However, the relatively vulnerable low-frequency band may not be a frequency band that a relevant antenna uses. It is understood from the graph 920 that a 700-MHz band that an antenna practically uses has an excellent transfer characteristic. Accordingly, compared to the capacitors 220 and 230, the capacitor 700 according to various embodiments of the present disclosure is stronger in terms of being able to withstand an impact and may maintain performance at a low frequency band. The result is that performance in a high frequency band is improved.

Figure 10:
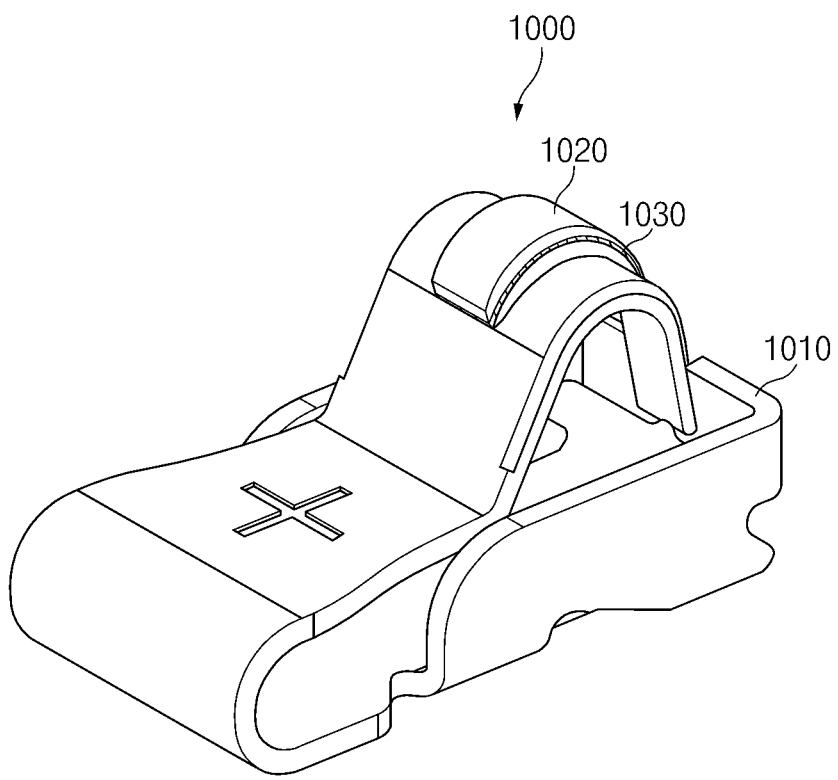
FIG. 10 is a perspective view illustrating an antenna clip and a capacitor using the antenna clip as a first conductor, according to various embodiments of the present disclosure.

FIG. 10 is a perspective view illustrating an antenna clip and a capacitor using the antenna clip as a first conductor, according to various embodiments of the present disclosure.

A capacitor 1000 in this illustration includes a metallic plate 1020 and an adhesive 1030 that are arranged in parallel with an upper side of an antenna 1010 (e.g., the connector 310 of FIG. 3). Since a surface area of the metallic plate 1020 is smaller than that of the metallic plate 720 of FIG. 7, the adhesive 1030 having relatively high dielectric constant may to be designed so as to have a sufficiently reduced thickness than the adhesive shown in FIG. 7.

The metallic plate 1020 may be connected to a housing of the electronic device. However, according to various embodiments of the present disclosure, the metallic plate 1020 may be a part of the housing of the electronic device and may correspond to an injection-molded area.

Figure 11:
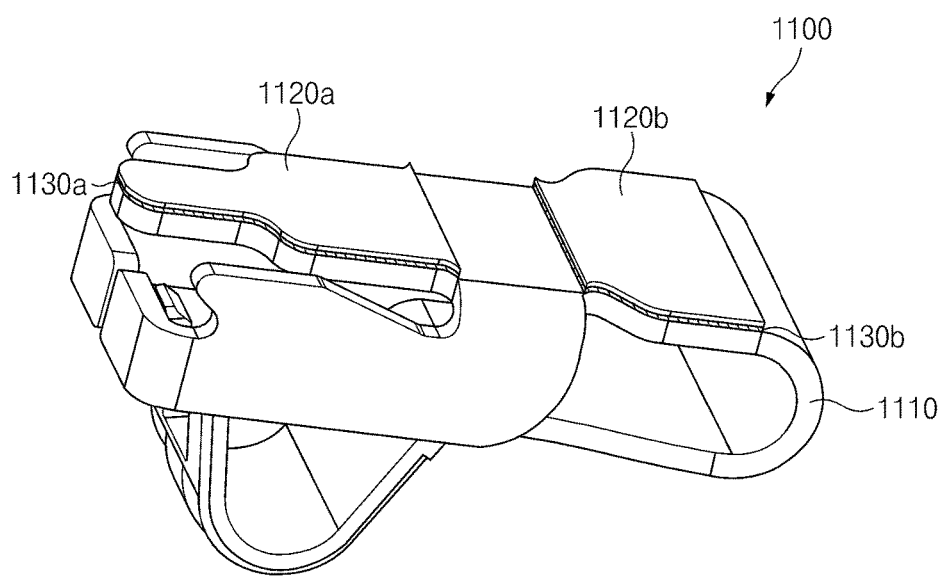
FIG. 11 is a perspective view illustrating an antenna clip and a capacitor using the antenna clip as a first conductor, according to various embodiments of the present disclosure.

FIG. 11 is a perspective view illustrating an antenna clip and a capacitor using the antenna clip as a first conductor, according to various embodiments of the present disclosure.

A capacitor 1100 of FIG. 11 is different in structure from the capacitor 700 of FIG. 7 in that a metallic plate is divided into two parts 1120a and 1120b. In this case, the two parts 1120a and 1120b of the metallic plate may be attached to a bottom surface of an antenna clip 1110 by adhesives 1130a and 1130b, respectively.

The capacitor 1100 of FIG. 11 may have a structure in which a first capacitor (including the part 1120a of the metallic plate as a conductor) and a second capacitor (including the part 1120b of the metallic plate as a conductor) are connected in parallel with each other. Accordingly, a sum of a capacitance value of the first capacitor and a capacitance value of the second capacitor may be a capacitance value of the capacitor 1100.

An antenna of an electronic device according to various embodiments of the present disclosure may utilize a capacitive component, thereby making it possible to use Alternating Current (AC) to operate the antenna and preventing a Direct Current (DC) from being leaked to the outside through a metallic housing of the electronic device. As such, the electronic device according to various embodiments of the present disclosure may be effective in terms of preventing an electric shock hazard and the ESD issue.

The apparatuses and methods of the disclosure can be implemented in hardware, and in part as firmware or via the execution of software or computer code in conjunction with hardware that is stored on a non-transitory machine readable medium such as a CD ROM, a RAM, a floppy disk, a hard disk, or a magneto-optical disk, or computer code downloaded over a network originally stored on a remote recording medium or a non-transitory machine readable medium and stored on a local non-transitory recording medium for execution by hardware such as by at least one processor, so that the methods described herein are loaded into hardware such as a general purpose computer, or a special processor or in programmable or dedicated hardware, such as an ASIC or FPGA.

As would be understood in the art, the computer, the processor, microprocessor, controller, control unit or the programmable hardware include memory components, e.g., RAM, ROM, Flash, etc., that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

In addition, an artisan understands and appreciates that a "processor", "microprocessor" "controller", or "control unit" constitute hardware in the claimed disclosure that contain circuitry, such as integrated circuitry, that is configured for operation. The control unit/controller may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc.

Under the broadest reasonable interpretation, the appended claims constitute statutory subject matter in compliance with 35 U.S.C. § 101 and none of the elements are software per se.

Nor are the claims directed to Abstract ideas, and constitute statutory subject matter under 35 U.S.C. § 101.

The definition of the terms "unit" or "module" as referred to herein are to be understood as constituting hardware circuitry such as a CCD, CMOS, SoC, AISC, FPGA, at least one processor or microprocessor (e.g. a controller or control unit) configured for a certain desired functionality, or a communication module containing hardware such as transmitter, receiver or transceiver, or a non-transitory medium comprising machine executable code that is loaded into and executed by hardware for operation, in accordance with statutory subject matter under 35 U.S.C. § 101 and do not constitute software per se.

The term "module" used herein may represent, for example, a unit including one of hardware, software and firmware or a combination thereof. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific integrated circuit (ASIC) chip, a field-programmable gate array (FPGA), and a programmable-logic device for performing some operations, which are known or will be developed.

At least a part of devices (e.g., modules or functions thereof) or methods (e.g., operations) according to various embodiments of the present disclosure may be implemented as instructions stored in a computer-readable storage medium in the form of a program module. In the case where the instructions are performed by a processor (e.g., the processor 120), the processor may perform functions corresponding to the instructions. The computer-readable storage medium may be, for example, the memory 130.

A computer-readable recording medium may include a hard disk, a floppy disk, a magnetic medium (e.g., a magnetic tape), an optical medium (e.g., CD-ROM, digital versatile disc (DVD)), a magneto-optical medium (e.g., a floptical disk), or a hardware device (e.g., a ROM, a RAM, a flash memory, or the like). The program instructions may include machine language codes generated by compilers and high-level language codes that can be executed by computers using interpreters. The above-mentioned hardware device may be configured to be operated as one or more software modules for performing operations of various embodiments of the present disclosure and vice versa.

A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. An antenna for an electronic device comprising:
a radiator;
an antenna clip connected to a metallic housing of the electronic device, in which a part of the antenna clip comprises at least a first conductor of a capacitor;
a feeding part connected with a first portion of the radiator; and
a ground connected with a second portion of the radiator and the capacitor,
wherein the capacitor further includes a second conductor arranged in parallel with the part of the antenna clip, and a dielectric between the first conductor and the second conductor, and
wherein at least a part of the metallic housing comprises the second conductor.

2. The antenna of claim 1, wherein the radiator comprises at least a part of the metallic housing.

3. The antenna of claim 1, wherein the dielectric includes an adhesive that affixes positions of the first conductor and the second conductor in parallel with each other.

4. The antenna of claim 3, wherein the antenna clip is connected to the feeding part and/or the ground through the second conductor of the capacitor.

5. The antenna of claim 4, further comprising a printed circuit board that comprises the feeding part and the ground, and wherein the second conductor is connected to the printed circuit board.

6. The antenna of claim 3, wherein the antenna clip is connected to the metallic housing through the second conductor.

7. The antenna of claim 1, wherein a size of an area of the second conductor and a distance between the first conductor and the second conductor are based on providing a value of capacitance that blocks a direct current (DC) component.

8. The antenna of claim 1, wherein a value of a dielectric constant of the dielectric is based on providing a value of capacitance that blocks a DC component.

9. The antenna of claim 3, wherein a thickness of the dielectric is based on providing a value of capacitance that blocks a DC component.

10. The antenna of claim 1, further comprising an inductor in series with the capacitor.

11. The antenna of claim 1, further comprising an inductor in parallel with the capacitor.

12. An antenna for an electronic device comprising:
a metallic housing;
a radiator comprising at least a part of the metallic housing;
an antenna clip connected with the metallic housing;
a direct current (DC) blocking member comprising at least a part of the antenna clip; and
a feeding part connected with a first portion of the radiator and a ground connected with a second portion of the radiator for operating the antenna,
wherein the DC blocking member includes a conductor arranged in parallel with the part of the antenna clip, and a dielectric between the conductor and the part of the antenna clip, and
wherein at least a part of the metallic housing comprises the conductor.

13. The antenna of claim 12, wherein the DC blocking member includes a capacitive component to block a flow of a direct current.

14. The antenna of claim 12, wherein the DC blocking member includes a capacitive component to block a flow of a direct current together with at least a part of the radiator that is arranged to correspond to the DC blocking member.

15. The antenna of claim 12, further comprising an inductor in series with the DC blocking member.

16. The antenna of claim 12, further comprising an inductor in parallel with the DC blocking member.

* * * * *